United States Patent [19]

Panigrahi

[11] 4,065,756
[45] Dec. 27, 1977

[54] ASSOCIATIVE MEMORY WITH NEIGHBORING RECIRCULATED PATHS OFFSET BY ONE BIT

[75] Inventor: Godavarish Panigrahi, East Windsor, N.J.

[73] Assignee: Burroughs Corporation, Detroit, Mich.

[21] Appl. No.: 666,575

[22] Filed: Mar. 15, 1976

[51] Int. Cl.$^2$ .................... G11C 15/04; G11C 21/00
[52] U.S. Cl. ...................................... 365/49; 365/78; 365/183
[58] Field of Search ............... 340/173 AM, 173 RC

[56] References Cited

U.S. PATENT DOCUMENTS

| | | | |
|---|---|---|---|
| 3,713,113 | 1/1973 | Kohzuma et al. | 340/173 AM |
| 3,997,882 | 12/1976 | Goyal | 340/173 AM |

OTHER PUBLICATIONS

Rux, "A Glass Delay Line Content-Addressed Memory System," IEEE Transactions on Computers, vol. C-18, No. 6, 6/69, pp. 512-520.
Bartlett, et al., "Associative Memory Chips: Fast Versatile-and here," Electronics, 8/17/70, pp. 96-100.
Tsui, "Associative-Memory Sequencing Arrangement," IBM Technical Disclosure Bulletin, vol. 15, No. 7, 12/72, pp. 2342-2343.

*Primary Examiner*—Stuart N. Hecker
*Attorney, Agent, or Firm*—Mervyn L. Young; Kevin R. Peterson

[57] ABSTRACT

This disclosure relates to a charge coupled device memory that is content or associative addressable with the respective word locations (loops) being searched concurrently although word access is serial in manner. Data bits in respective word loops are arranged in a staggered manner such that when the first bit of the first word is at its comparison location, the second bit of the second word is at its comparison location and so forth. The comparand and mask bits are shifted serially from comparison location to comparison location and recirculated in synchronism with the recirculation of the word loops. Content addressing logic includes a series of match bit shift registers, one for each comparison location, to record match occurrences. When a word match occurs, the address of the respective word loop is sent to the memory to read out the data bits stored therein. Various embodiments are disclosed to illustrate that the memory may be formed of any number of word locations having any number of bit positions per word.

11 Claims, 4 Drawing Figures

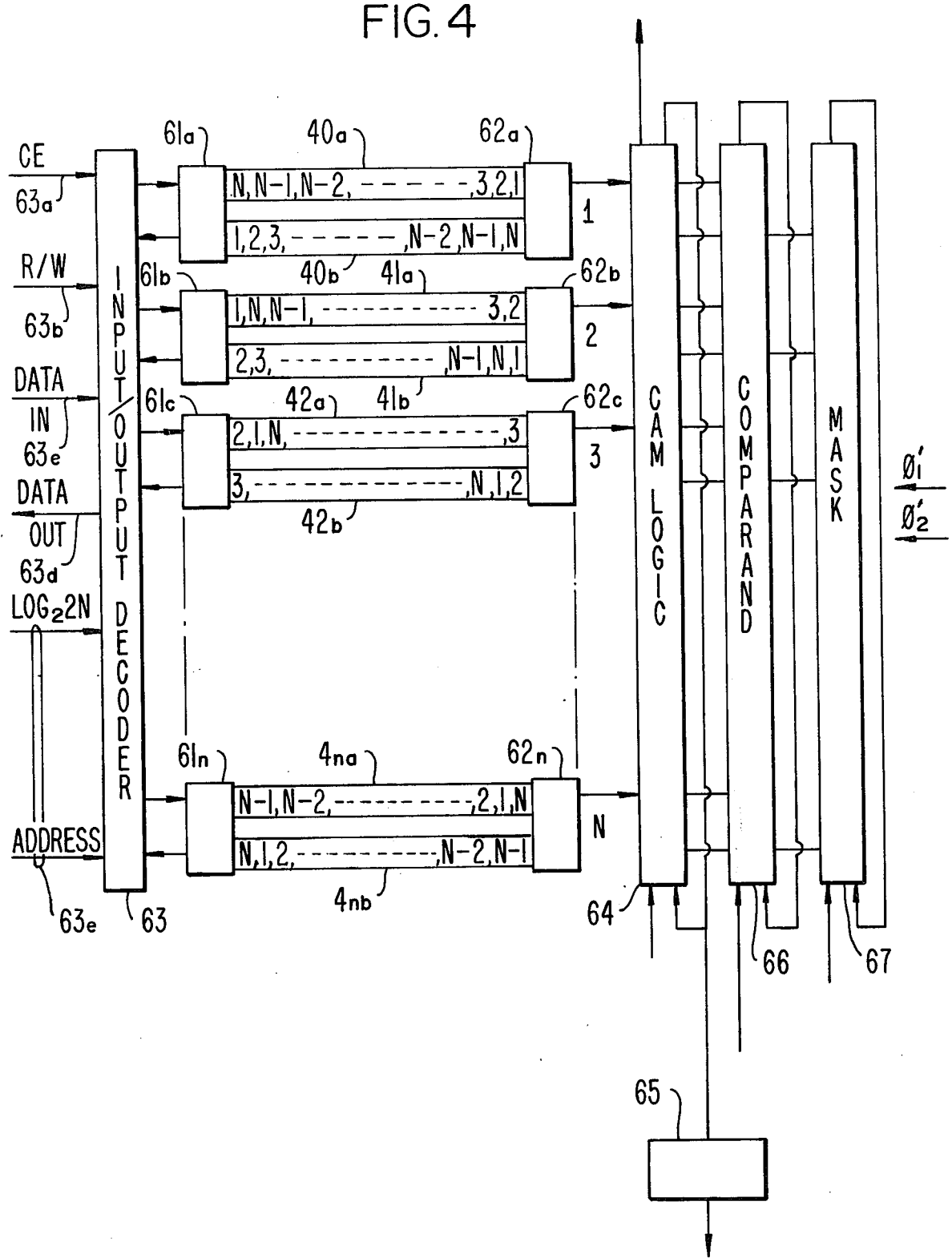

ASSOCIATIVE MEMORY WITH NEIGHBORING RECIRCULATED PATHS OFFSET BY ONE BIT

BACKGROUND OF THE INVENTION

1. Field of the Invention

This invention relates to a content addressable charge coupled (CCD) device memory and more particularly to such a memory where associative processing is performed concurrently on words but in sequential fashion with the words being properly aligned for comparison.

2. Background of the Invention

Addressing by content or associative addressing is a desirable feature for many computer memory applications. However, such content addressable memories are not widely used because of their costs. As a result, presently available content addressable memories are of relatively small size and also relatively expensive. With the advent of large scale integrated circuitry and, particularly, charge coupled devices (CCD's), memory manufacturing costs can be reduced and capacity increased to a large extent such that the application of content addressable or associative memories should become more practical and widespread. Prior art CCD memories were not normally designed to be content addressable. As a result, the content addressing or associative addressing are primarily done by softward techniques that, in turn, increase the memory accessing time. With the implementation of the content addressing functions into the memories themselves, faster and less expensive content addressable memories would become more readily available for information retrieval, filing, symbolic addressing and the like.

CCD memories are considered to be dynamic in the sense that the data bits are circulated in loops with the accessing of respective loops at particular locations. Basically, CCD's are fabricated as MOS or MIS integrated circuits, wherein potential wells are formed by the application of voltage pulses to the substrate to activate MOS or MIS capacitors. Voltage charges may be inputed and the charge pockets shifted along various points throughout the substrate by the proper application of voltage pulses to these capacitors. Refresh circuitry is required to maintain the magnitude of the charge pockets which would otherwise dissipate. Fabrication of the substrates and the means for moving the charge pockets around the substrates are well described in the prior art as illustrated by the Kosonocky U.S. Pat. Nos. 3,758,794 and 3,760,202. These patents also disclose signal regeneration circuits, methods and means for operating CCD's in plural phase configurations, and clocking and timing means. A number of papers which discuss the application and technology of charge coupled devices include W. S. Boyle and G. E. Smith, "Charge-Coupled Devices — A New Approach to MIS Device Structures," *IEEE Spectrum,* July 1971; Altman, "The New Concept for Memory and Imaging: Charge Coupling," *Electronics,* June 21, 1971; J. E. Garnes and W. F. Kosonocky, "Charge-Coupled Devices and Applications," *Corporate Engineering Services,* RE-18-5-22, August 1972, page 78.

Since CCD memories sequentially circulate data, that data must be operated upon sequentially. It would be desirable to have a charge coupled device memory in which the data bits are circulated in a number of loops that are operated on concurrently to provide the appearance of word parallel processing and to ascertain that each of the words was properly aligned for content comparison and retrieval.

It is then an object of the present invention to provide a charge coupled device memory which is content addressable or associative addressable.

It is another object of the present invention to provide a content addressable charge coupled device memory wherein the content addressing function is performed by logic associated with the charge coupled device.

It is still another object of the present invention to provide a content addressable charge coupled device memory in which there is concurrent word processing.

SUMMARY OF THE INVENTION

In order to accomplish the above described objects, the present invention resides in a charge coupled device memory having a plurality of data loops established therein, each loop being in the form of a pair of shift registers with data in each of the shift registers being shifted in a direction opposite that to the other member of the pair. Input and output circuits are coupled to each pair at one end of the loop and a plurality of regeneration amplifiers connect each pair of shift registers at the other end of the loop. The outputs of the respective regeneration amplifiers are also coupled by way of content addressing logic to comparand and mask shift registers. The comparand and mask bits in those registers are shifted and recycled in synchronism with the shifting of the data in the respective memory loops. To this end, the data bits in the respective word loops are stored in those loops in a staggered manner such that when the first bit of the first word is presented to the content addressing logic, so too is the second bit of the second word so presented, the third bit of the third word so presented, . . . and the Nth bit of the Nth word is so presented. The comparand and mask bits are recycled in synchronism with the word loop recirculation. At the end of the associative or comparison cycle, the results of any comparison are stored in a set of match flip-flops and can be shifted out upon command. The output of a memory address counter is started at the beginning of the match collection such that the address of the word loop where the match occurred is obtained and that word may then be read out from the corresponding output circuitry as the data bits of that word arrive at the output circuitry. A number of such charge coupled device memories can be arranged in parallel to form the content addressable memory system of any size desirable.

A feature then of the present invention resides in a charge coupled device memory having a plurality of word loops formed therein each of the word loops being completed by a regeneration amplifier the output of which is supplied by way of content addressing logic to comparand and mask shift registers with the data bits in each word loop being staggered from word loop to word loop such that concurrent comparison is achieved as the comparand and mask bits are recirculated through their respective comparand and mask shift registers.

DESCRIPTION OF THE DRAWINGS

The above and other objects, advantages and features of the present invention will become more readily apparent from a review of the following specification when taken in conjunction with the drawings wherein:

FIG. 4 is a schematic diagram of still another embodiment of the present invention.

DESCRIPTION OF THE INVENTION

Figure 1:
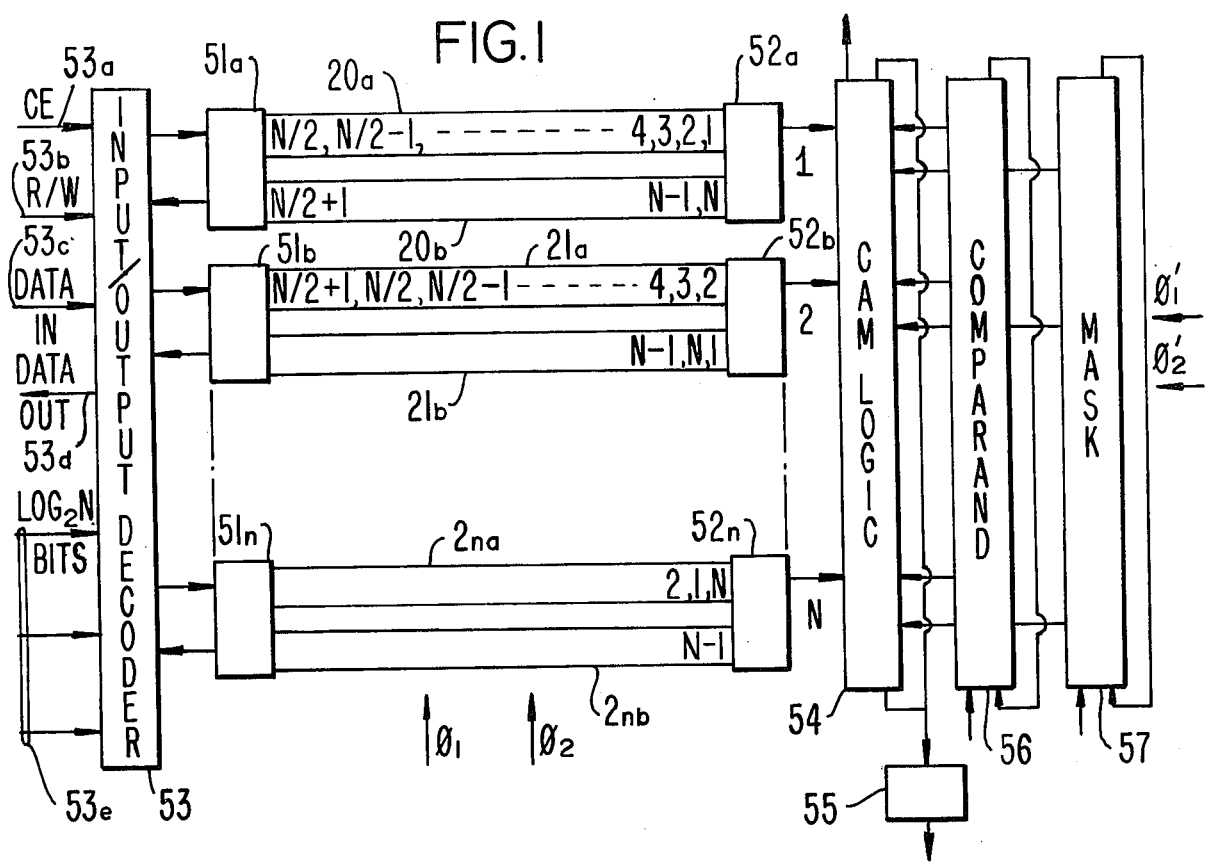
FIG. 1 is a schematic diagram of an embodiment of the present invention.

The present invention is directed toward a content addressable memory employing a plurality of dynamic circular memories which are concurrently accessed for comparison with the comparand so as to quicken the comparison and retrieval process. An embodiment of the present invention adapted for this purpose is shown in FIG. 1 which illustrates a memory having N shift register loops each capable of holding N bits. Each of the shift register loops is formed of opposing data bit paths, for example 20a,20b; 21a,21b; . . . ; 2Na,2Nb where the data paths in each pair transfer data in opposite directions. At one end of the data path pairs, data is transferred from one path to the other by regeneration amplifiers 52a, . . . ,52n. The other end of each data path pair is closed by another set of regeneration amplifiers 51a, . . . , 52n. The input/output decoder 53 serves to select the input/output operation on the loop corresponding to the input address on address lines 53e.

Data is written into the memory of FIG. 1 and read out therefrom by way of input/output unit 53. In turn, the data is received by input/output unit 53 from an external source by way of serial date-in line 53c and supplied to the external source by way of serial data-out line 53d. The particular word loop to be accessed for storage and retrieval is selected by address lines 53e which comprise that number of lines required to address N number of words, i.e. log$_2$N lines. Whether the memory access is to be a read operation or a write operation is determined by a signal on R/W line 53b.

When the memory system of the present invention is in the content addressing mode, the comparand or argument to be searched in the memory is supplied to comparand register 56 which is a serial shift register of N bits, the same number of bits that were stored in each of the word locations of the memory. When the search argument is less than N bits, a mask for the comparand is supplied to mask register 57 which is also a serial shift register of N bits. The comparison between the masked comparand and the respective data bits in each of the word loops of the memory is provided by the content addressing (CAM) logic 54 which includes a plurality of flip-flops, one for each word loop, that are to be set each time a bit comparison occurs. CAM logic 54 also includes a shift register, having one bit position for each flip-flop, to receive signals therefrom as each flip-flop is set.

As has been indicated above, a feature of the present invention is the concurrent comparison of the comparand with each of the word loops even though the complete comparison with any one word is in a serial fashion. This concurrent operation will now be described. As indicated in FIG. 1, data is stored in the memory such that the bits in successively addressed shift registers or word loops are offset from its neighboring word loop by one bit. For example, at the beginning of the associative cycle, bit number 1 of word number 1 is presented out by the output of regeneration amplifier 52a, bit number 2 of word number 2 is at the output of word loop number 2, . . . and bit number N of word number N is presented out by the output of word loop N. Also, at the beginning of the associative cycle, comparand register 56 and mask register 57 have been loaded such that bit number 1 of the respective comparand and mask is at the top of the respective shift registers and bit number N is at the bottom of the respective shift registers. During the associative cycle operation, the data in the memory loops as well as the comparand and the mask data in the shift registers move synchronously at the same frequency. As the data is moved each bit position, the comparative operation is performed.

As the respective data in all of the shift registers and loops is moved each bit position, the comparative operation is performed and then the data is shifted by another bit and so on. The comparison operation is described by the expression $$A = (D \oplus C)M + M,$$

where $A$ = Associativity, $D$ = Data, $C$ = Comparand, and $M$ = Mask.

At the beginning of the associative cycle, the respective match flip-flops are set to one (1). If A→0, the respective match flip-flop is reset and corresponds to a mismatch of data, if A→1, the corresponding match flip-flop is set and corresponds to a match of data. When at least a single word match has occurred, match collection flip-flop 55 is set. At the end of the associative cycle when the memory loops and the comparand and mask registers have moved N bit positions, the results of any associative comparison has been stored in one of a series of shift registers associated with the respective flip-flops. The contents of these shift registers can be shifted out at the end of the associative operation upon command.

At the end of the associative cycle, the respective match bits have any information regarding the result of the associative comparison as well as the spatial information regarding where the match occurred. If the output of the address counter (to be described below) is started at the beginning of the match collection, its contents can be gated with the match bits such that the address of the word loop where the match occurred will be obtained. This address is then sent to input/output unit 53 of FIG. 1 to cause the readout of the word loop where the match occurred.

More flexibility in the usage of individual memory devices (the individual CCD's) is obtained if the match collection logic and circuitry and address generation counters are external to those devices. Another consideration is that if the memory addresses are generated on the devices, there will result an unnecessary increase in the number of lead pins required for each device.

Figure 2:
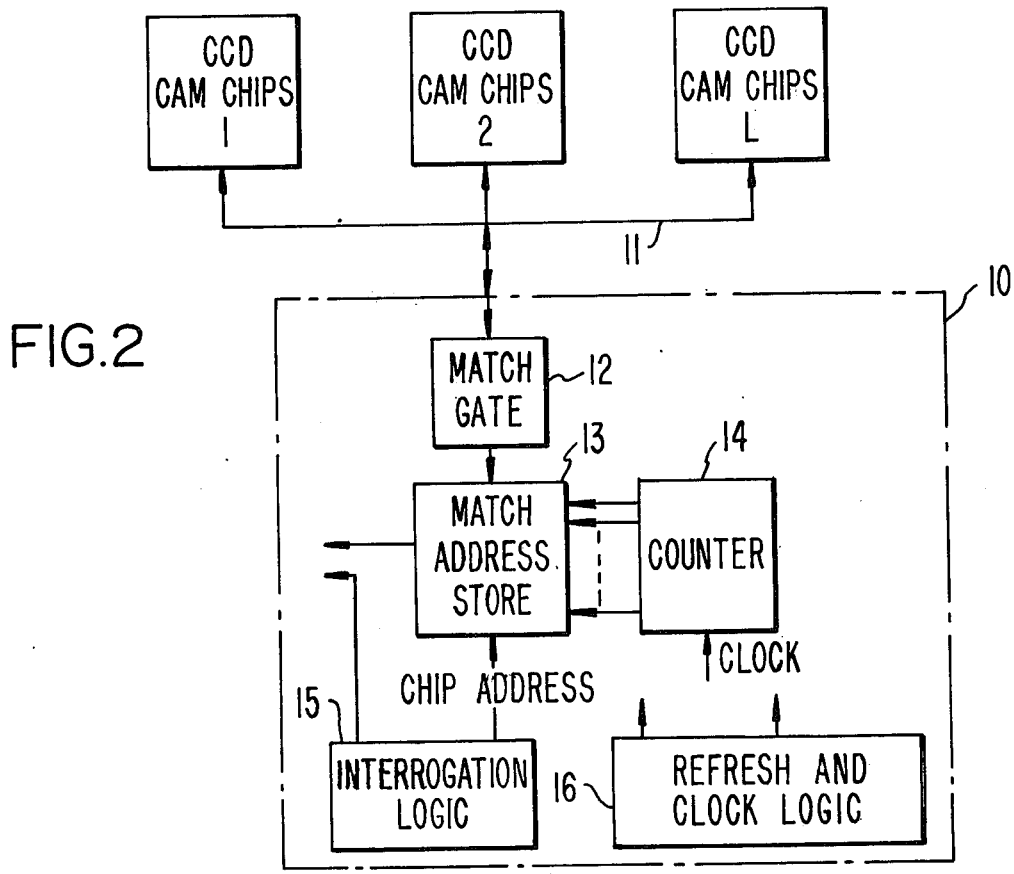
FIG. 2 is a diagram illustrating the manner in which the embodiment of FIG. 1 may be employed to form memory systems of different sizes.

An overall memory system employing the devices of the present invention is illustrated in FIG. 2. The system includes an array of memory devices of the type illustrated in FIG. 1 each of the devices being coupled to data and control bus 11 and from there to memory control unit 10. During the loading cycle, the comparand and mask data is supplied from the memory control unit to all of the devices in serial fashion. At the end of the associative operation, the match information which results from that operation is collected and the control unit queries each device to find out if there was a match. If there was a match, the match data is gated out and the match address is derived and stored in match address store 13 of FIG. 2. In order to reduce match collection time, the match collection output is collected at the device level. Since a number of devices can be grouped into a hierarchy of modules, interrogation logic 15 queries each module at a time and, if there was a match in a module, then individual devices in the module are queried one by one. Match address store 13 retains all of the match addresses. The match address will consist of the device address obtained from the interrogation logic 15 and the word address derived from the match data of that particular device. To this end address counter 14 is started at the beginning of match collection cycle. At the end of the match collection cycle, the match address store has the address of all matches. When desired, the words which produced the matches can be obtained by accessing the memory with the address already stored in the match address store. As was indicated in FIG. 1, the respective word loops and shift registers are driven by clock signals of two phases, $\phi 1$ and $\phi 2$. The signals are supplied to the devices by refresh and clock logic 16. Refresh and clock logic 16 keeps a count of the status of the data from cycle to cycle by applying the shifting clock frequency to a refresh counter.

It is not necessary that the associative operation be started in any device when the first data bit of the first word loop is presented out by its corresponding regeneration amplifier with the remaining word loops presenting out their corresponding data bits as was described above. For example, the comparand and mask data can be sent to the device in a manner such that, when the loading operation is completed, the bits in the comparand register and the mask register are aligned with all corresponding bits in the respective word loops. This is achieved by inputing the comparand and mask data and then moving them until they align against bits in the word loops whose positions correspond to the order of the comparand and mask bits. An alignment cycle is presented for this purpose. Alternatively, the comparison operation of the associative cycle can be delayed until the data in the word loops come around and align with the comparand and mask bits. In either case, the number of cycles required for data alignment is given by the output of the refresh counter.

Figure 3:
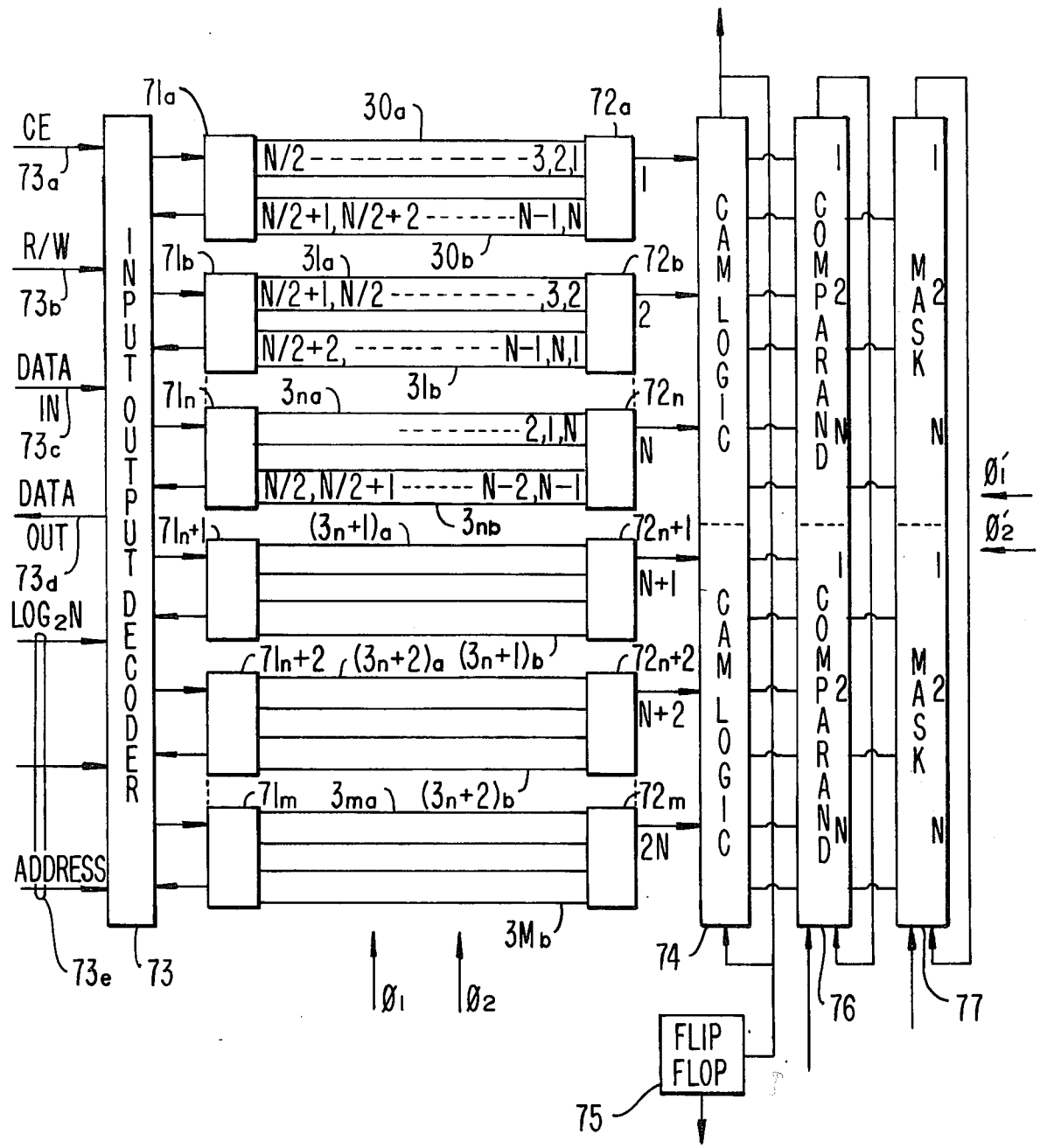
FIG. 3 is a schematic diagram of another embodiment of the present invention.

In the embodiment of FIG. 1, there are N word loops of N bits each with the comparand and mask data also including N bits each. However, it is not necessary that the number of word locations and the number of bits in each word be equal. In FIG. 3, there is an illustrated embodiment of the present invention which has 2N word loops each having N bits per word. Each of the word loops is made up of a pair of shift registers $30a,30b; \ldots; 3m,3mb$. As in the case of the embodiment of FIG. 1, each pair of shift registers in FIG. 3 is coupled at one end by regeneration amplifiers $72a, \ldots, 72m$. Also similar to the embodiment of FIG. 1, the respective word loops are completed at their other end by the input/output circuits $71a, \ldots, 71m$. In the embodiment of FIG. 3, each word loop contains N bits although there are 2N word loops. Input/output unit 73 of FIG. 3 is similar to input/output unit 53 of FIG. 1 except that the number of address lines to the address decoder has one more line than as illustrated in FIG. 1. Content addressing (CAM) logic 74 of FIG. 3 differs from the corresponding logic 54 of FIG. 1 in that it will have twice as many comparators and shift register bits for the collection of match bits. Similarly, the comparand and mask data are duplicated in comparand shift register 76 and mask shift register 77.

Another embodiment of the present invention is illustrated in FIG. 4 which is also designed to hold 2N words of N bits; however, this embodiment only requires N comparators in the CAM logic. In FIG. 4, the respective word loops formed of shift registers $40a,40b; 41a,41b; \ldots; 4na,4nb$ are each adapted to hold 2N bits per loop or two words per loop. Otherwise, input/output unit 63 is the same as input/output unit 53 of FIG. 1 including the number of address lines thereto. The input/output circuits $61a, \ldots, 61n$; the regeneration amplifiers $62a, \ldots, 62n$; comparand shift register 66; and mask register 67 are the same as the corresponding elements in the embodiment of FIG. 1. It will be understood that in the embodiment of FIG. 4, the data in each of the word loops will have to be circulated twice in their corresponding word loops in order to complete the associative operation and, therefore, CAM logic 64 will include 2N sets of flip-flops and shift register bits corresponding to the 2N words stored in the device to give the results of the comparison for all the 2N words. In a variation thereof, the associative operation can be performed in two associative cycles with only N sets of flip-flops and corresponding shift registers.

From the embodiment shown, it will be understood that one could organize a memory device employing the present invention which device contains words of any length and size suiting the application. Such devices could be used in a memory system of a type illustrated in FIG. 2 with only minor modifications required.

EPILOGUE

A content addressable memory organization has been disclosed which allows all the words in memory to be compared with a given comparand or search argument in a concurrent manner as distinct from the prior art technique of processing each word in the memory, a word at a time in sequence. Since data is stored in CCD's in a sequential manner, such comparisons cannot be made in truly parallel fashion. It will be appreciated that the present invention can be implemented with any sequential circular memory including magnetic bubble (magnetic domain walls) devices, disks, delay lines, or shift registers of various sorts. However, the present invention is particularly adapted to CCD memories because of their high storage density and the ease with which logic circuitry can be designed into the memory device.

While but a few embodiments of the present invention have been described, it will be apparent to those skilled in the art, that variations and modifications can be made therein without departing from the spirit and scope of the invention as claimed.

What is claimed is:
1. An associative memory comprising:
   a plurality of circular dynamic memory data paths in each of which one or more series of bits representing words are serially stored such that corresponding significant bits in the respective paths are offset by one bit from corresponding bits in neighboring paths;
   comparison logic;
   a comparand shift register having individual bit positions being coupled by said comparison logic to individual ones of said memory data paths; and
   timing means coupled to said data paths and to said comparand register to shift comparand bits in said comparand register in synchronism with the shifting of all of the data bits in said respective data paths, such that the comparand data bits will be concurrently compared with individual data bits from all of said data paths.

2. An associative memory according to claim 1 wherein said memory data paths are formed of pairs of shift registers coupled at both ends to circulate said data bits.

3. An associative memory according to claim 2 wherein said shift registers are charge coupled device shift registers.

4. An associative memory according to claim 1 which includes N memory data paths each capable of holding N data bits.

5. An associative memory according to claim 1 wherein there are 2N data paths each capable of holding N data bits.

6. An associative memory accordng to claim 1 further including:
a mask shift register coupled to said comparand shift register and to said comparison logic to provide mask bits for comparison with said data bits in said data paths and said comparand bits.

7. A content addressable memory comprising:
a plurality of circularly coupled data shift registers to store data bits to be recirculated therethrough, each of said shift register having one or more series of bits representing words which are serially stored therein such that corresponding significant bits in the respective shift registers are offset by one bit from corresponding bits in neighboring shift registers;
comparison logic;
a comparand shift register having individual bit positions being coupled by said comparison logic to individual ones of said shift registers; and
timing means coupled to said data shift registers and to said comparand shift register to shift comparand bits in said comparand register in synchronism wit the shifting of data bits in all of said respective data shift registers, such that the comparand data bits will be concurrently compared with individual data bits from all of said data shift registers.

8. A content addressable memory according to claim 7 wherein said shift registers are charge coupled device shift registers.

9. A content addressable memory according to claim 7 which includes N memory data shift registers each capable of holding N data bits.

10. A content addressable memory according to claim 7 wherein there are 2N data shift registers each capable of holding N data bits.

11. A content addressable memory according to claim 7 further including:
a mask shift register coupled to said comparand shift register and to said comparison logic to provide mask bits for comparison with said data bits in said data shift registers and said comparand bits.

* * * * *

UNITED STATES PATENT OFFICE
CERTIFICATE OF CORRECTION

Patent No. 4,065,756                    Dated February 7, 1978

Inventor(s) Godavarish Panigrahi

It is certified that error appears in the above-identified patent and that said Letters Patent are hereby corrected as shown below:

Col. 1, line 42, change "pockets" to read --packets--

Col. 1, line 46, change "pockets" to read --packets--

Col. 1, line 48, change "pockets" to read --packets--

Col. 1, line 60, change "Garnes" to read --Carnes--

Col. 4, line 20, change "$A=(D\oplus C)M+M,$" to read --$A=(D\oplus C)\bar{M}+M,$--

Col. 8, line 10, change "wit" to read --with--

*Signed and Sealed this*

*Twenty-third* Day of *May 1978*

[SEAL]

Attest:

RUTH C. MASON
*Attesting Officer*

LUTRELLE F. PARKER
*Acting Commissioner of Patents and Trademarks*